United States Patent
Weber et al.

(10) Patent No.: US 6,241,079 B1
(45) Date of Patent: Jun. 5, 2001

(54) DEVICE FOR CONVEYING SUBSTRATES THROUGH A SUBSTRATE PROCESSING PLANT

(75) Inventors: Klaus Weber, Bretten; Bernd Mahner, Mühlacker, both of (DE)

(73) Assignee: STEAG HamaTech AG (DE)

( * ) Notice: Subject to any disclaimer, the term of this patent is extended or adjusted under 35 U.S.C. 154(b) by 0 days.

(21) Appl. No.: 09/403,330
(22) PCT Filed: Apr. 9, 1998
(86) PCT No.: PCT/EP98/02083
  § 371 Date: Oct. 16, 1999
  § 102(e) Date: Oct. 16, 1999
(87) PCT Pub. No.: WO98/48450
  PCT Pub. Date: Oct. 29, 1998

(30) Foreign Application Priority Data

Apr. 17, 1997 (DE) .............................. 197 16 123

(51) Int. Cl.⁷ .................................................. B65G 15/00
(52) U.S. Cl. ......................................... 198/817; 198/626.5
(58) Field of Search .............................. 198/606, 626.1, 198/626.3, 626.5, 817; 414/217, 786, 222

(56) References Cited

U.S. PATENT DOCUMENTS

| | | | |
|---|---|---|---|
| 4,217,977 | 8/1980 | Tam | 198/341 |
| 4,795,022 * | 1/1989 | Simmons | 198/817 X |
| 4,925,012 * | 5/1990 | Guntensperger | 198/817 X |
| 4,938,649 | 7/1990 | Horst et al. | 414/412 |
| 4,947,784 | 8/1990 | Nishi | 414/404 |
| 5,611,858 | 3/1997 | Zejda | 118/50 |

FOREIGN PATENT DOCUMENTS

| | | |
|---|---|---|
| 4341634A1 | 6/1995 | (DE) . |
| 19530858C | 1/1997 | (DE) . |
| 19529945A | 2/1997 | (DE) . |

* cited by examiner

*Primary Examiner*—James R. Bidwell
(74) *Attorney, Agent, or Firm*—Robert W. Becker & Associates

(57) ABSTRACT

A device for conveying substrates through a substrate treatment device has a base transport belt defining a transport plane and two lateral transport belts positioned at a first spacing above the base transport belt. The two lateral transport belts are laterally spaced at a second spacing to one another. Each one of the two lateral transport belts defines a lateral transport plane. Each one of the lateral transport planes is positioned at a slant to the transport plane of the base transport belt. The two lateral transport belts and the base transport belt have cutouts for receiving vertically poisoned substrates. At least one of the first spacing and the second spacing is changeable. Also, the slant angle between at least one of the lateral transport planes to the transport plane of the base transport belt is changeable.

11 Claims, 4 Drawing Sheets

DEVICE FOR CONVEYING SUBSTRATES THROUGH A SUBSTRATE PROCESSING PLANT

BACKGROUND OF THE INVENTION

The invention relates to a device for conveying substrates through a substrate processing plant.

Devices of this kind are known for moving substrates, especially CDs, through cooling and drying devices. The substrates are placed into baskets moving on a circular path or into slots provided in circular devices. Such carousel transporting devices, however, have great dimensions and require large size drive devices so that such known devices are cost-intensive. Furthermore, loading of such carousel transporting devices with substrates, respectively, removal of substrates therefrom, is difficult and requires high constructive expenditures.

For devices of the aforementioned kind it is also known to employ a screw conveyor which rotates and moves forward the substrates positioned in the conveying path. This has, however, the disadvantage that a relative movement between the screw conveyor and the substrates occurs, generating friction which causes particles to be rubbed off and thus results in contamination.

From DE 43 41 634 A1, upon which the present invention is based, a device for transporting disk-shaped substrates in a substrate treatment device is known in which three toothed belts are provided with which the substrates can be conveyed through the treatment device. This device, however, is designed for only a single substrate shape and size and cannot be adapted to different specifications, such as, for example, different substrate sizes.

From U.S. Pat No. 4,947,784 a device for transferring wafers from a first wafer securing device (wafer cassette) into a second wafer securing device (wafer boat) is known. Such a so-called handling device for wafers is not designed for transporting wafers through a treatment device and is not suitable for this purpose.

From DE 195 30 858 C1 a handling device is known in which the wafers are transported by suction plates. The handling device of DE 195 29 945 A1 realizes gripping and securing of flat substrate by an inner gripping device, wherein the gripping device engages a hole provided at the interior of the substrates, with the gripping device supported at the edge of the inner hole.

It is an object of the invention to improve a device known from DE 43 41 634 A1 such that an adaptation of the device to different specifications, for example, different substrate sizes, is possible in a simple manner.

SUMMARY OF THE INVENTION

The aforementioned object is inventively solved by the features of claim 1. By providing an adjustable spacing of the lateral transport belts relative to one another and/or to the base transport belt, not only an adaption of the device to the respective specifications, especially to different substrate sizes, but also a readjustment of the spacings required for a reliable securing and transporting of the substrates is possible in a simple manner.

A further preferred embodiment of the invention is that the angle between the transport planes of the two lateral transport belts and the transport plane of the base transport belt can be changed. In this manner, an optimal adjustment of the support locations of the substrates transported on the transport belts is possible. Furthermore, it is also possible to adapt the device with simple means to different substrate shapes or substrate sizes, be it round or rectangular shapes. For rectangular substrates, the angle between the transport planes of the lateral transport belts and the transport plane of the base transport belt is preferably 90°.

The invention therefore has the object to provide a device for movement of substrates through a substrate treatment device with which a carousel-type movement of the substrate on a circular path or substrate wear can be avoided and a constructively simple, space-saving, and easily manipulated device is possible.

The aforementioned object is inventively solved by a base transport belt and two lateral transport belts which respectively have cutouts for a vertical receiving action for the substrates. Due to the inventive features, i.e., using three transport belts, a linear movement of the substrates results with the advantage that the device is very simple, space-saving, and wear-free, and furthermore can be adjusted easily to the respective requirements, for example, the size of the substrate.

According to an especially advantageous embodiment of the invention, the cutouts for vertically receiving the substrates are embodied as intermediate spaces of teeth at the transport belt provided in the form of a toothed belt. Such toothed belts can be manufactured inexpensively.

For adapting the inventive transport device the spacing of the lateral transport belts to the base belt can be changed. By adjusting the lateral transport belts to the base belt, an adaptation of the device to different substrate sizes is possible in a simple manner.

In the case of round substrates, such as, for example, CDs or DVDs, it is especially advantageous when the transport planes of the two lateral transport belts have an angle of greater than 90° to the transport plane of the base transport belt. This allows an easy insertion into and removal of the substrates from the inventive transport device, whereby however the supporting action of the substrates in the transport device is safe and secure.

The transport belts are preferably guided about guide pulleys and drive wheels which are embodied especially as gear wheels when the transport belts or at least one of the transport belts on the side facing away from the transport surface, i.e., its drive side, is embodied as a toothed belt. A toothed design of the transport belts on both sides is therefore very advantageous.

Another very advantageous embodiment of the invention resides in that each one of the three transport belts is guided in its own transport belt device and is driven by its own drive unit. In this manner, the individual transport belt devices are individual units so that the arrangement, adaptation, and alignment of the transport belts to different substrates is possible.

It is very advantageous to provide the drive units of the three transport belts such that they operate synchronously to one another. This results not only in a uniform drive velocity for all three transport belts, but also in a synchronous alignment of the cutouts for receiving the substrates. Instead of such a synchronous control, it is also possible to provide the drives of the three transport devices, respectively, the three transport belts with a common gear box, for example, a play-free gear box, in order to ensure a synchronous movement of three drive belts, respectively, their cutouts for receiving the substrates. The gear box can also be driven by a drive common to all three transport belts.

The transport belts or at least parts of the transport belts which are in contact with the substrates, are preferably comprised of a special material that prevents contamination, such as Teflon, or a material which is not sensitive to contamination, respectively, can be easily cleaned.

Loading and/or unloading of the inventive transport device, respectively, the three transport belts with substrates, is preferably carried out with suction grippers and/or inner grippers, which engage the edge of the inner hole of, for example, CDs. Such gripping devices are simple and prevent the subsequent contamination of the substrates after the treatment process.

The inventive transporting device is especially advantageous in connection with substrate drying devices or cooling devices which are used especially in the production of CDs.

The term substrate is to include all disk-shaped treatment objects, i.e., not only CDs, including audio CDs, ROM-CDs, so called recordable CDs (CDRs), digital video disks (DVDs) etc., but also masks for producing semiconductor components, display units etc.

BRIEF DESCRIPTION OF THE DRAWINGS

The invention will be explained in the following with the aid of an embodiment making reference to the figures. It is shown in.

DESCRIPTION OF THE PREFERRED EMBODIMENTS

Figure 1:
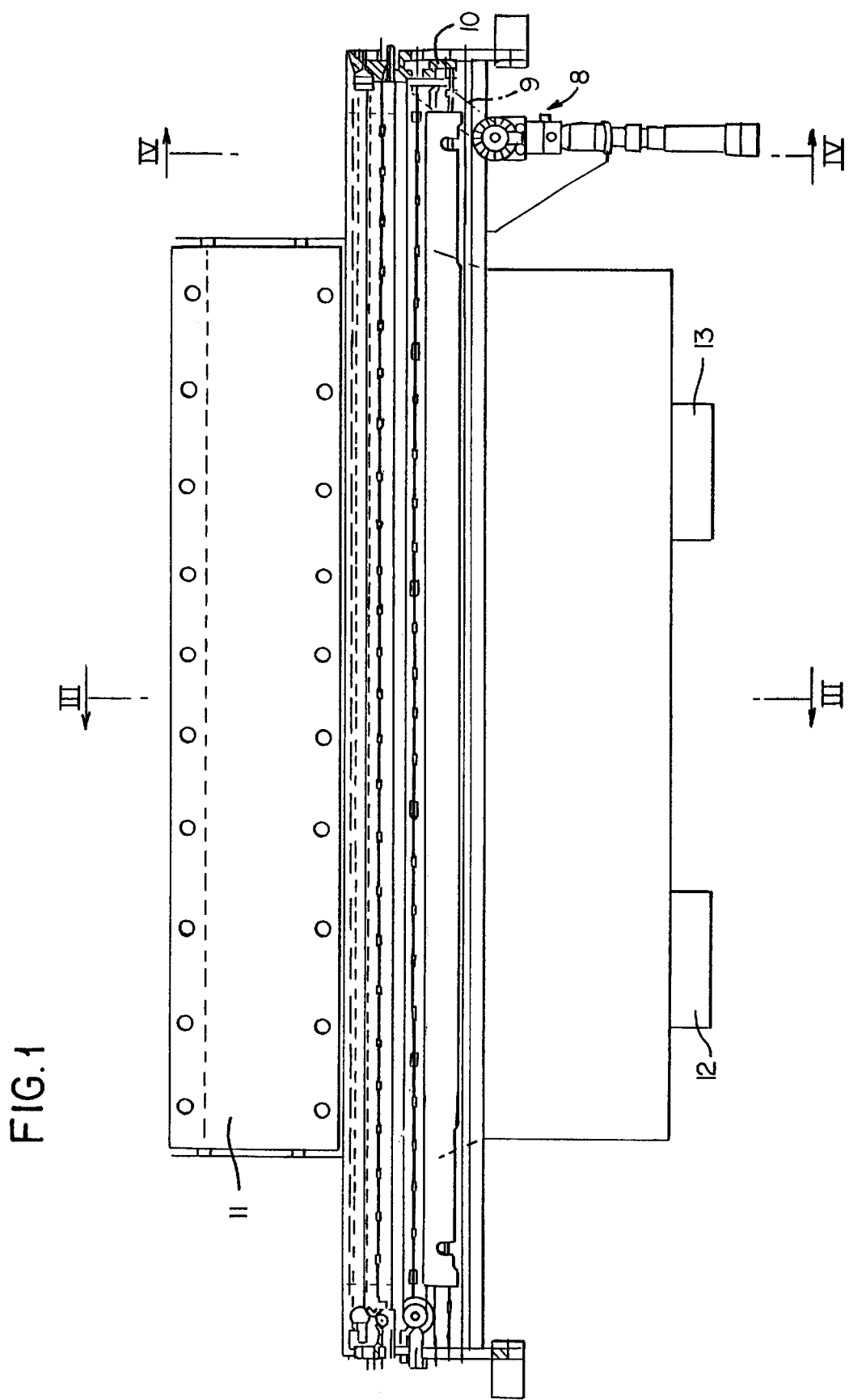
FIG. 1 the inventive transport device for a drying device for drying CDs in a side view.
Figure 2:
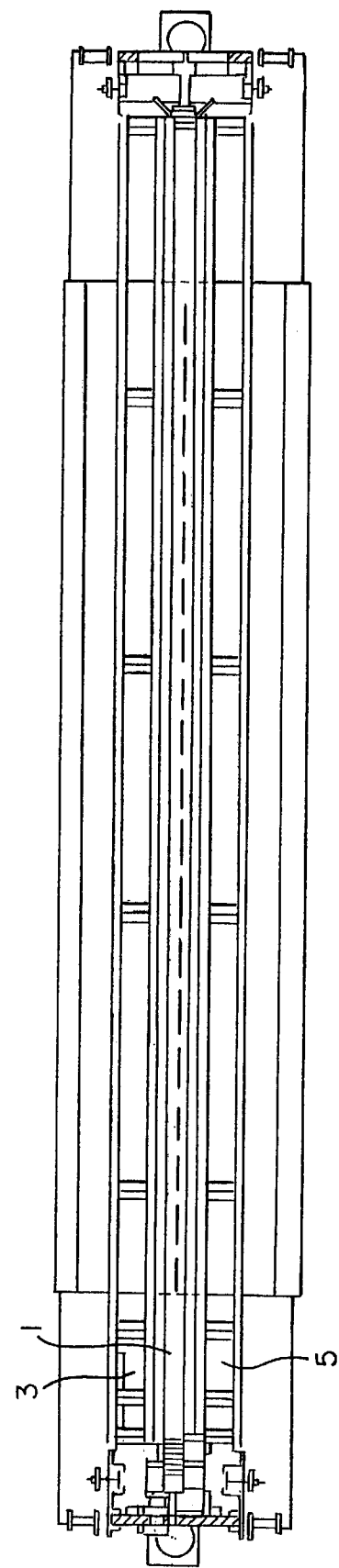
FIG. 2 the device of FIG. 1 in a plan view.
Figure 3:
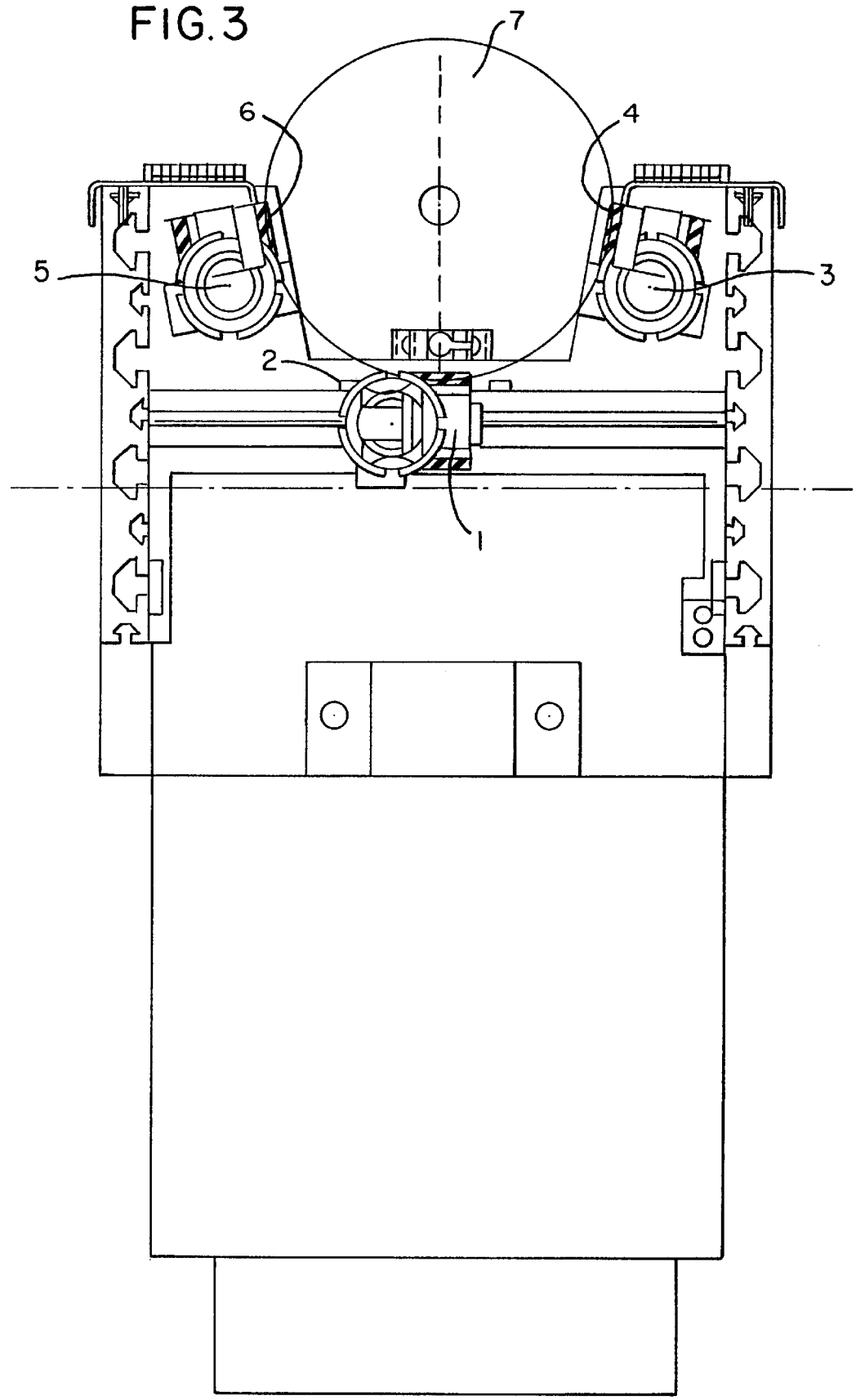
FIG. 3 an enlarged sectional view along the section line III—III shown in FIG. 1.
Figure 4:
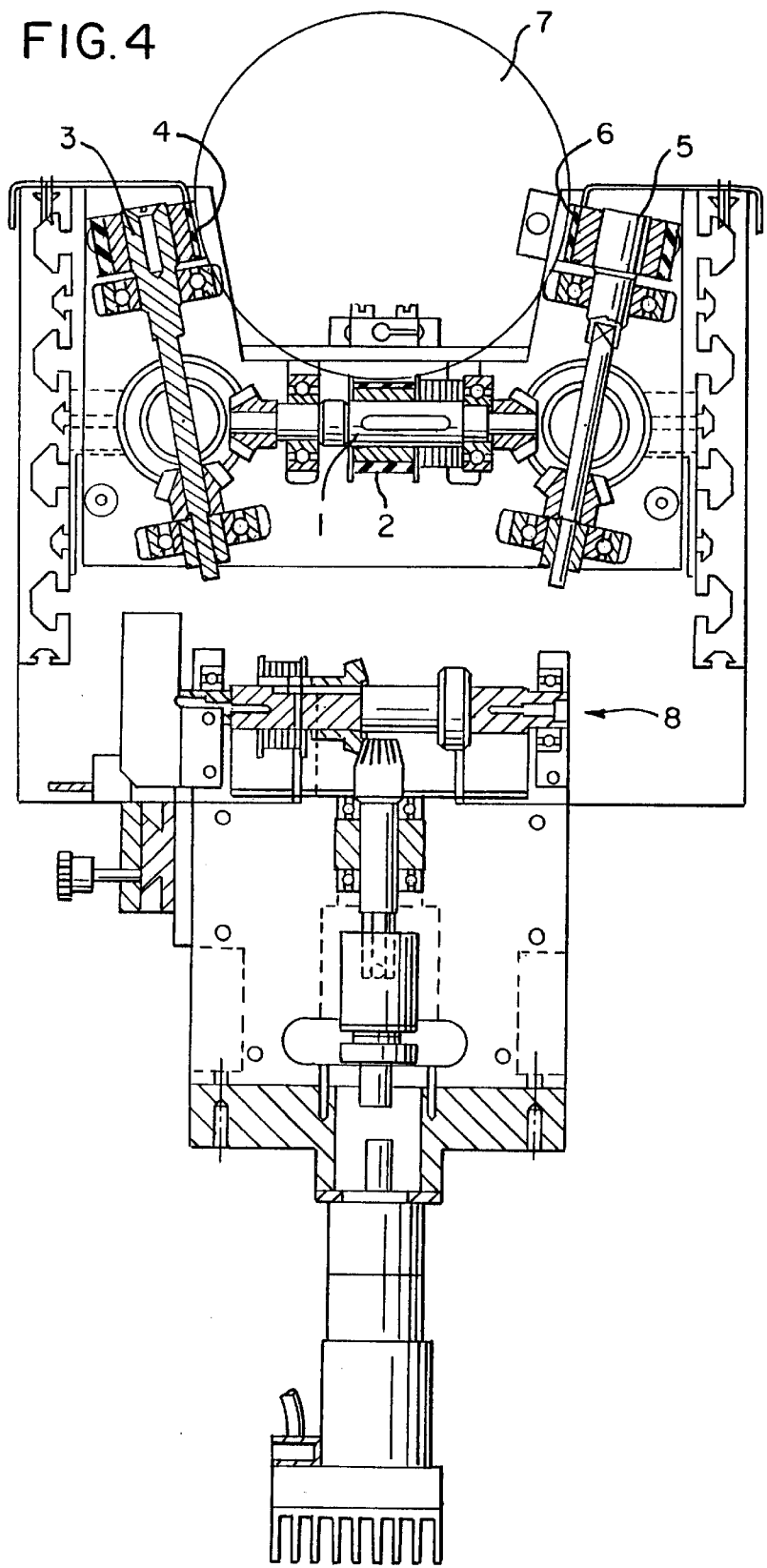
FIG. 4 an enlarged sectional view along the section line IV—IV shown in FIG. 1.

As is shown in the figures, the inventive device comprises a first transport belt device 1 with a base transport belt 2, a second transport belt device 3, comprising a lateral transport belt 4, and a third transport belt device 5, having a lateral transport belt 6. The transport belts 2, 4, 6 have cutouts, respectively, intermediate spaces between teeth of a toothed belt for receiving the substrates 7. Such cutouts or intermediate spaces are provided in all three transport belts. As can be seen especially in FIGS. 1 and 4, the drive of the transport belts 2, 4, 6 is realized by a common drive unit 8 which is driven by drive belt 9 and a gearbox 10 for synchronously moving the three transport belts 2, 4, 6.

In the represented embodiment of the inventive conveying device for drying the substrates, a blower 11 is provided which extends over a large portion of the length of the movement direction with which air, either heated by the blower 11 or already heated air coming from the exterior, is continuously blown onto the transport belts 2, 4, 6 or onto the stepwise transported substrates 7. The depleted drying air is guided away from the drying housing to the outlet openings 11, 12.

The invention has been explained with the aid of a preferred embodiment. However, to a person skilled in the art numerous deviations and designs are obvious without departing from the gist of the invention. For example, the transport belt devices 1, 3, 5 can be embodied independent of one another so that they can be changed in their position relative to one another in order to be used for transporting different substrates 7. In the represented embodiment, the substrate 7 is round and the lateral transport belts 4, 6 have an angle to the transport belt 2 which is greater than 90° so that the substrate 7 is secured safely at three locations at the lower half of the substrate disk. For larger round substrates 7, the lateral transport belt devices 3, 5 are simply moved farther outwardly and, optionally, the angle of the lateral transport belt devices relative to the base belt 2 is changed in order to ensure a support action of the substrates as optimal as possible. In the case of square or rectangular substrates, the lateral transport belt devices are arranged or pivoted such that the lateral belts 4, 6 extend perpendicularly to the transport plane of the base transport belt 2.

The present invention is, of course, in no way restricted to the specific disclosure of the specification and drawings, but also encompasses any modifications within the scope of the appended claims.

What is claimed is:

1. A device for conveying substrates (7) through a substrate treatment device (11), said device comprising:

a base transport belt (2) defining a transport plane;

two lateral transport belts (4, 6) positioned at a first spacing above said base transport belt (2);

said two lateral transport belts (4, 6) laterally spaced a at second spacing to one another;

each one of said two lateral transport belts (4, 6) defining a lateral transport plane;

each one of said lateral transport planes positioned at a slant to said transport plane of said base transport belt (2);

wherein said two lateral transport belts (4, 6) and said base transport belt (2) have cutouts for receiving substrates (7) positioned in a vertical position;

wherein at least one of said first spacing and said second spacing is changeable;

wherein a slant angle of said slant between at least one of said lateral transport planes to said transport plane of said base transport belt (2) is changeable.

2. The device according to claim 1, wherein said base transport belt (2) and said two lateral transport belts (4, 6) are toothed belts having teeth and wherein said cutouts are intermediate spaces between said teeth.

3. The device according to claim 1, wherein said slant angle of said lateral transport planes is greater than 90°.

4. The device according to claim 1, further comprising guide wheels and drive wheels correlated with said base transport belt (2) and said lateral transport belts (4, 6) for guiding said base transport belt (2) and said lateral transport belts (4, 6).

5. The device according to claim 4, wherein each one of said two lateral transport belts (4, 6) and said base transport belt (2) together with said correlated guide wheels and drive wheels defines a separate transport belt unit (1, 3, 5), wherein each one of said separate transport belt units (1, 3, 5) has a separate drive unit.

6. The device according to claim 5, wherein said separate drives are synchronously controlled.

7. The device according to claim 5, further comprising a common gear box (10), wherein said separate drives are connected to said a common gearbox (10).

8. The device according to claim 1, wherein at least parts of said, base and lateral transport belts (2, 4, 6) in contact with the substrates (7) are comprised of Teflon.

9. Device according to claim 1, further comprising at least one suction gripping device for loading or unloading the substrates (7) onto and from said base and lateral transport belts (2, 4, 6).

10. Device according to claim 1, further comprising at least one gripping device for engaging an edge of an inner hole of the substrates (7) for loading or unloading the substrates (7) onto and from said base and lateral transport belts (2, 4, 6).

11. Device according to claim 1, wherein the substrate treatment device is a substrate drying device or a substrate cooling device (11, 12, 13).

* * * * *